(12) United States Patent
Kim

(10) Patent No.: US 7,785,997 B2
(45) Date of Patent: Aug. 31, 2010

(54) METHOD FOR FABRICATING SEMICONDUCTOR DEVICE

(75) Inventor: Ju-Hyun Kim, Cheonan-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 288 days.

(21) Appl. No.: 12/134,917

(22) Filed: Jun. 6, 2008

(65) Prior Publication Data
US 2008/0305622 A1 Dec. 11, 2008

(30) Foreign Application Priority Data
Jun. 7, 2007 (KR) ...................... 10-2007-0055498

(51) Int. Cl.
*H01L 21/3205* (2006.01)
*H01L 21/4763* (2006.01)
(52) U.S. Cl. ........................ 438/585; 257/392; 438/588
(58) Field of Classification Search ................. 257/392; 438/275, 585, 588
See application file for complete search history.

(56) References Cited
U.S. PATENT DOCUMENTS

| | | | |
|---|---|---|---|
| 6,734,113 B1 * | 5/2004 | Cho et al. ................... | 438/763 |
| 7,371,640 B2 * | 5/2008 | Kim et al. ................... | 438/257 |
| 2006/0008962 A1 * | 1/2006 | Ozeki et al. ................. | 438/197 |
| 2006/0141714 A1 * | 6/2006 | Lee ............................. | 438/275 |
| 2006/0270174 A1 * | 11/2006 | Chen et al. .................. | 438/373 |
| 2007/0293029 A1 * | 12/2007 | Ogawa et al. ............... | 438/585 |
| 2009/0224332 A1 * | 9/2009 | Tsutsumi et al. ............ | 257/392 |

* cited by examiner

*Primary Examiner*—Fernando L Toledo
(74) *Attorney, Agent, or Firm*—Sherr & Vaughn, PLLC

(57) ABSTRACT

A method for fabricating a semiconductor device includes forming at least two gate insulating layers having different thickness on a substrate having low, medium and high voltage regions; and then depositing a gate layer material on the gate insulating layers; and then forming a first etch mask on the gate layer material; and then forming gate electrodes in the low, medium and high voltage regions by etching the gate layer material using the first etch mask; and then forming a second etch mask to expose a thickest one of the gate insulating layers, the gate electrode and the first etch mask each formed in the high voltage region while covering the remaining gate insulating layers, the gate electrodes and the first etch masks formed in the low and medium voltage regions; and then etching the thickest gate insulating layer using the second etch mask; and then removing the first and second etch masks. Thereby, the first etch mask used for forming the gates remains without being removed even after the gate is formed to perform a role of a barrier during etching the gate insulating layer.

20 Claims, 12 Drawing Sheets

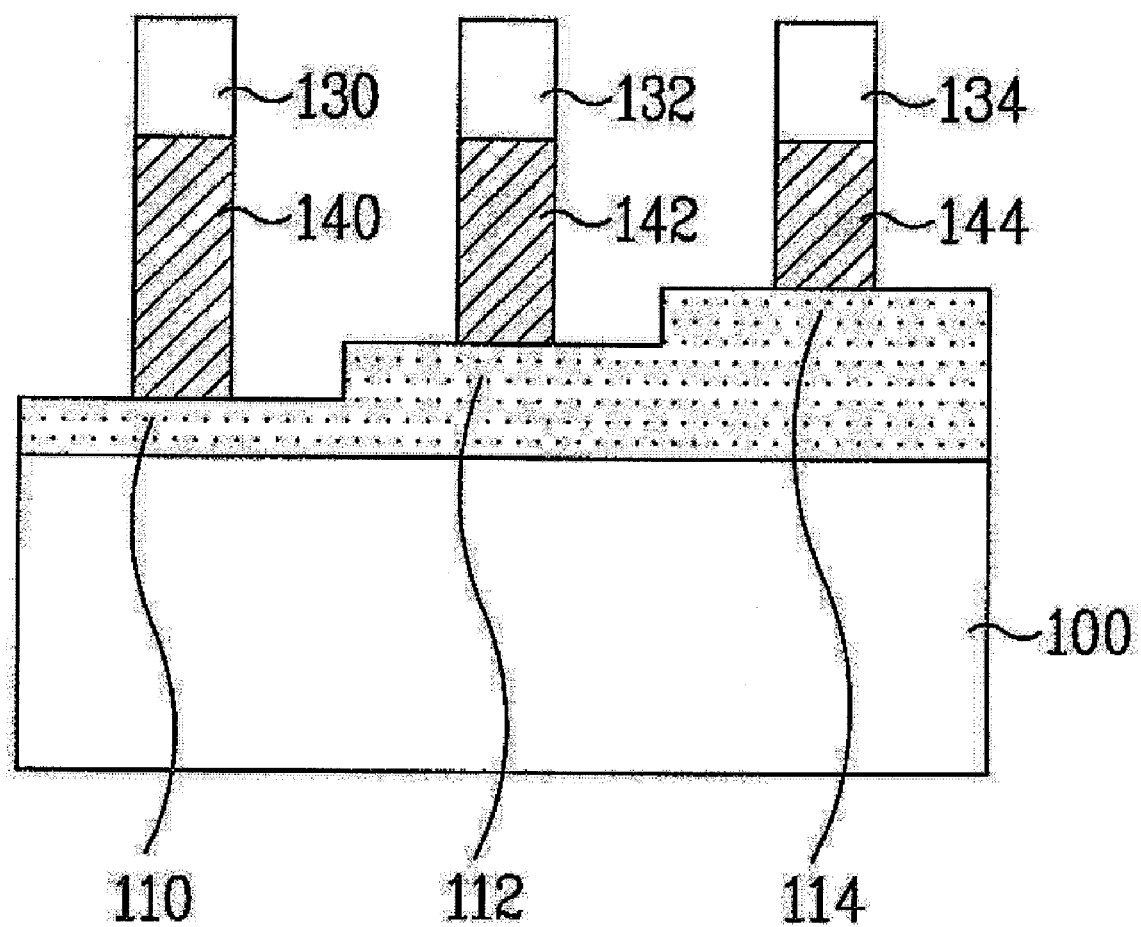

Figure 1A:
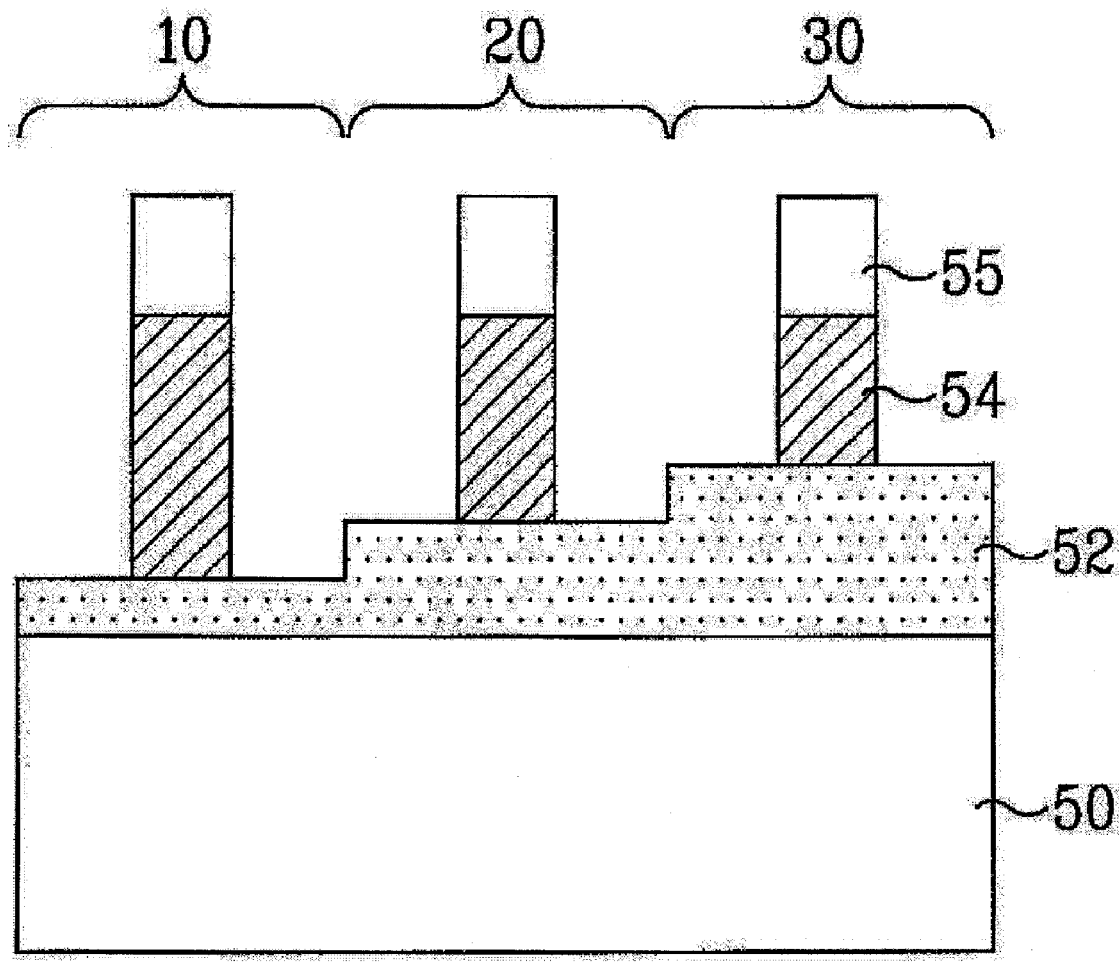

ness of gate insulating layer 52 at medium voltage region 20 is less than that of gate insulating layer 52 in high voltage region 30. As illustrated in example FIG. 1B, after forming gates 54 at each region 10, 20, and 30, photo mask 55 is removed by an ashing and then stripping process. As illustrated in example FIG. 1C, photo masks 56 and 58 are formed to expose gate insulating layer 52 at high voltage region 30 while covering low voltage region 10 and medium voltage region 20. As illustrated in example FIG. 1D, the thickness of gate insulating layer 52 at high voltage region 30 is etched to the thickness of gate insulating layer 52 at medium voltage region 20 by a reactive ion etching using photo masks 56 and 58. As illustrated in example FIG. 1E, photo masks 56 and 58 are removed.

METHOD FOR FABRICATING SEMICONDUCTOR DEVICE

The present application claims priority under 35 U.S.C. 119 to Korean Patent Application No. P10-2007-0055498 (filed on Jun. 7, 2007), which is hereby incorporated by reference in its entirety.

BACKGROUND

An image sensor is a semiconductor device that converts an optical image into an electrical signal.

Figure 1B:
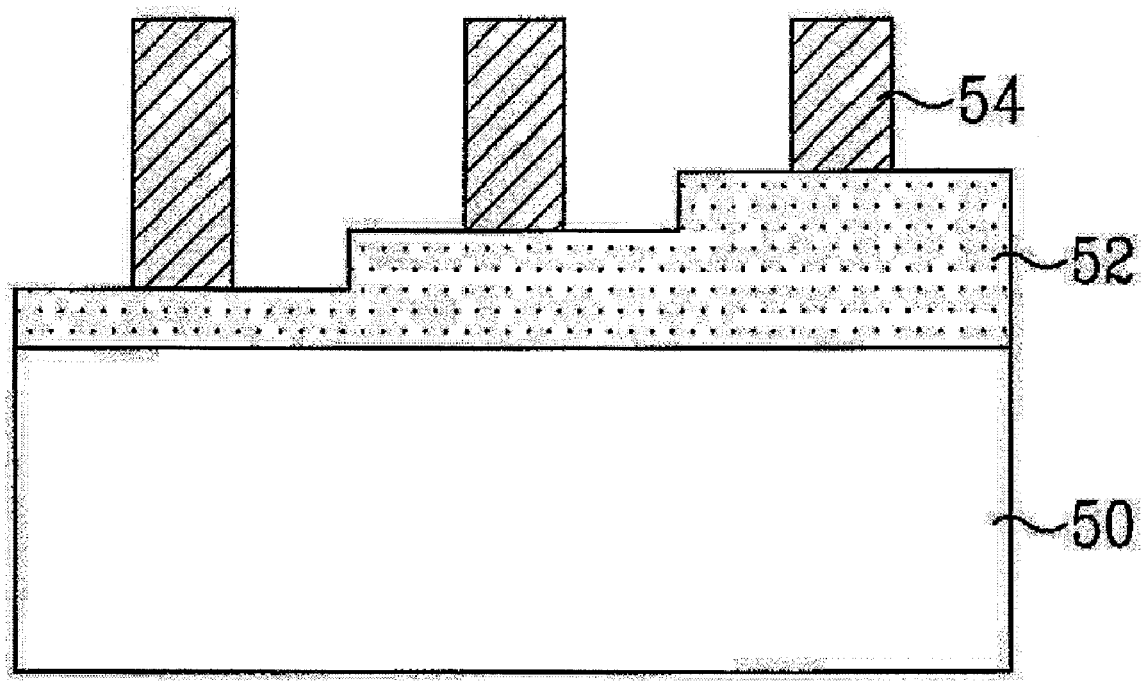

As illustrated in example FIG. 1A, a method for fabricating a semiconductor device such as an LDI can include gates 54 for low voltage region 10, medium voltage region 20 and high voltage region 30 formed on and/or over semiconductor substrate 50 using photo mask 55. A thickness of gate insulating layer 52 at low voltage region 10 is less than that of gate insulating layer 52 at medium voltage region 20. The thickness of gate insulating layer 52 at medium voltage region 20 is less than that of gate insulating layer 52 in high voltage region 30. As illustrated in example FIG. 1B, after forming gates 54 at each region 10, 20, and 30, photo mask 55 is removed by an ashing and then stripping process. As illustrated in example FIG. 1C, photo masks 56 and 58 are formed to expose gate insulating layer 52 at high voltage region 30 while covering low voltage region 10 and medium voltage region 20. As illustrated in example FIG. 1D, the thickness of gate insulating layer 52 at high voltage region 30 is etched to the thickness of gate insulating layer 52 at medium voltage region 20 by a reactive ion etching using photo masks 56 and 58. As illustrated in example FIG. 1E, photo masks 56 and 58 are removed.

Figure 1C:
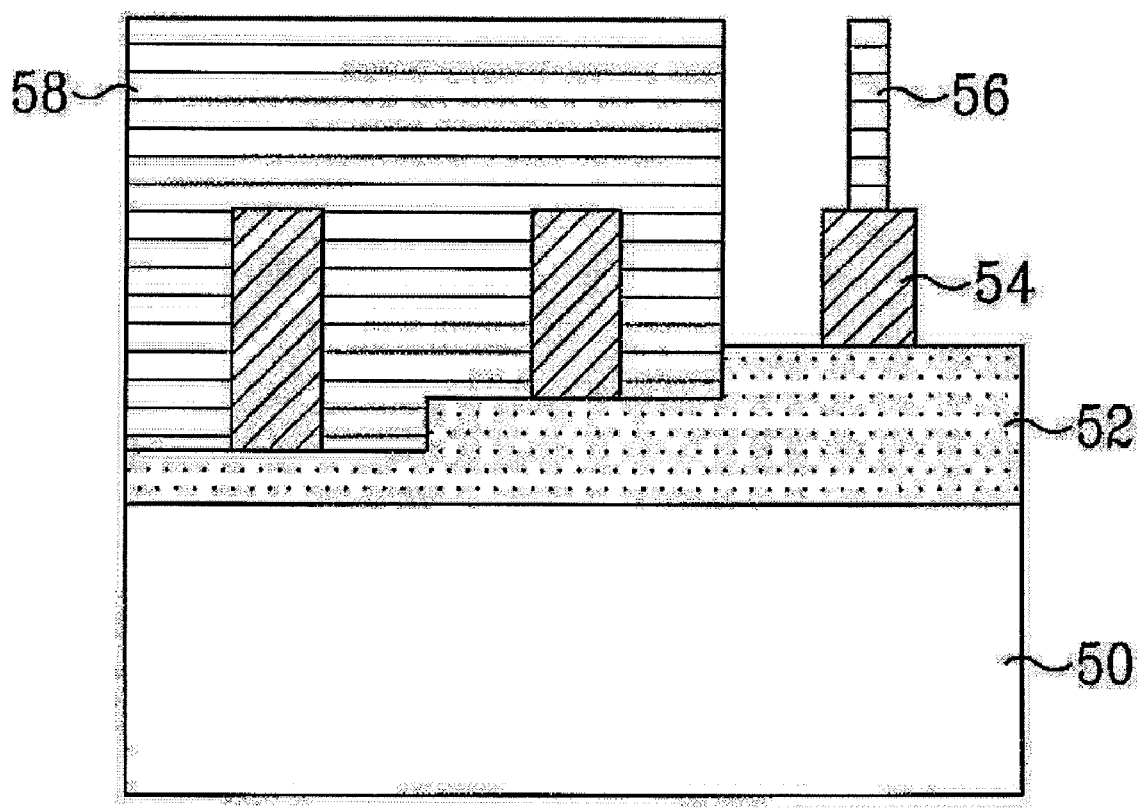
Figure 1D:
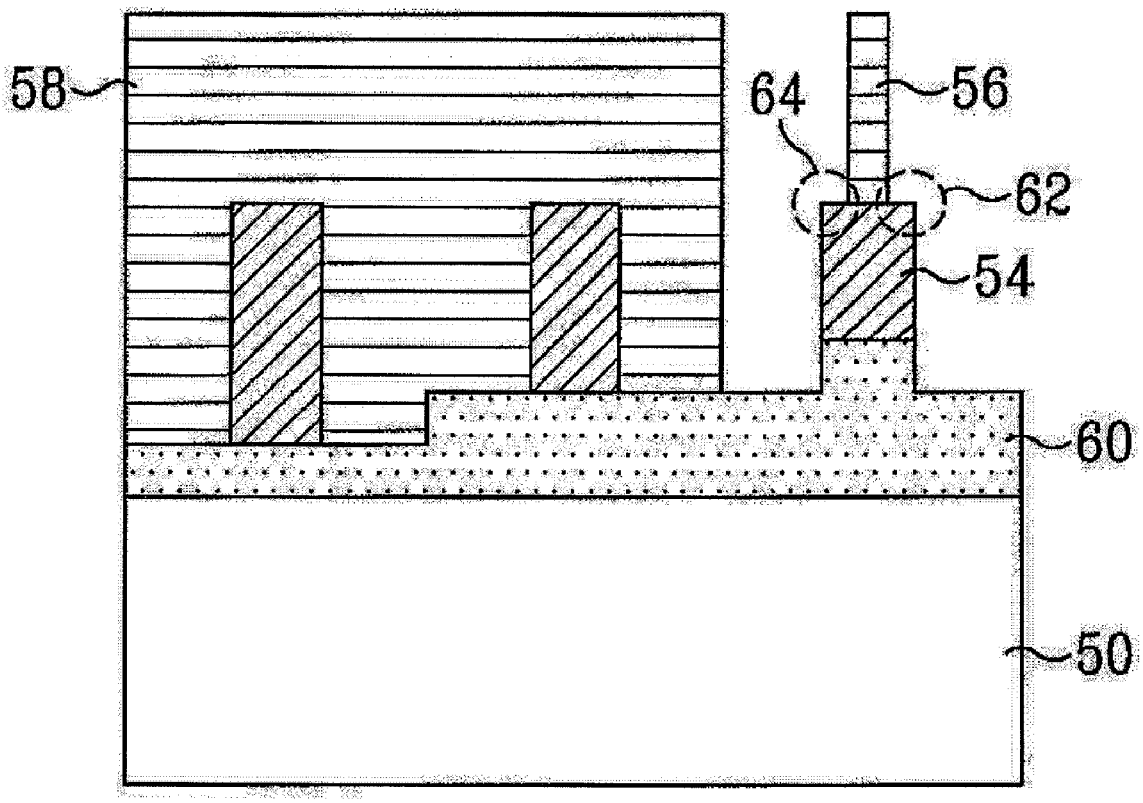
Figure 1E:
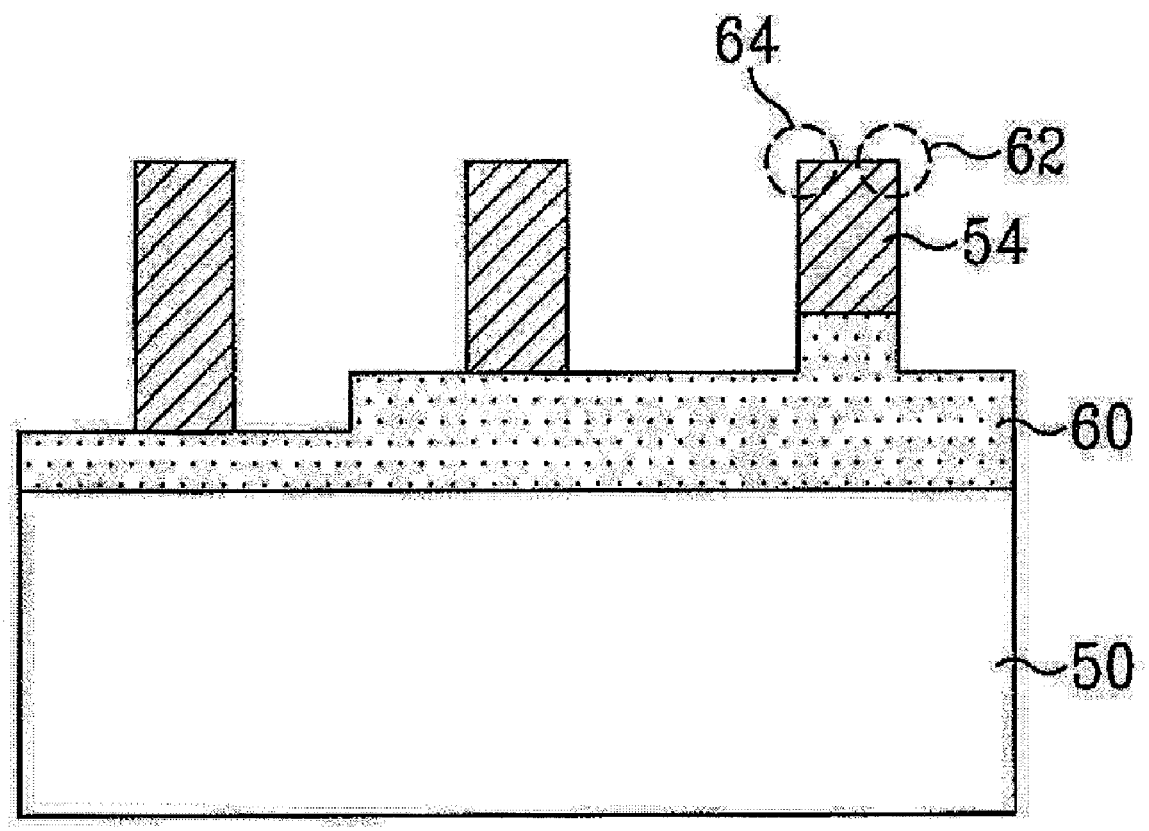

As illustrated in example FIGS. 1C and 1D, with the method for fabricating the semiconductor device as described above, photo mask 56 may be formed on and/or over an uppermost surface of gate 54 at high voltage region 30. The reason is that when gate insulating layer 52 at high voltage region 30 is etched after exposing the entire gate 54 at high voltage region 30 without forming photo mask 56, the entire gate 54 is attacked upon etching gate insulating layer 52. Therefore, photo mask 56 is formed on and/or over gate 54 at high voltage region 30. If the width of photo mask 56 is largely formed to protect gate 54 at high voltage region 30, gate insulating layer 52 around gate 54 at high voltage region 30 cannot be etched. The width of photo mask 56 formed on the uppermost surface of gate 54 at high voltage region 30 may be formed less (for example, 100 nm or more) than that of gate 54 in process margins (overlay, CD variation). Exposed portions 62 and 64 of edges of gate 54 at high voltage region 30 are subjected to an etching poly attack upon etching gate insulating layer 52.

SUMMARY

Embodiments relate to a semiconductor device such as a liquid crystal driver integrated circuit (LDI) and a method for fabricating the same having multiple gates.

Embodiments relate to a method for fabricating a semiconductor device having multiple gates that can prevent gates from being subjected to an etching attack during the etching of gate insulating layers while simplifying the overall process.

Embodiments relate to a method for fabricating a semiconductor device that may include at least one of the following steps: forming at least two gate insulating layers having different thickness on and/or over a substrate; and then depositing a layer material for forming gates on and/or over the gate insulating layers; and then forming a first etch mask on and/or over the layer material for forming the gates; and then forming gate electrodes by etching the layer material for forming the gates using the first etch mask; and then forming a second etch mask to expose a thickest gate insulating layer, the gate electrode and the first etch mask formed on and/or over the thickest gate insulating layer and to cover the remaining regions.

Embodiments relate to a method for fabricating a semiconductor device that may include at least one of the following steps: forming gate insulating layers including a plurality of portions with different thickness on and/or over a semiconductor substrate; and then depositing layer materials for forming gates on and/or over the gate insulating layers including the plurality of portions with different thickness; and then forming a first etch mask on the layer materials for forming the gates; and then forming gate electrodes on and/or over each of the plurality of portions with different thickness by etching the layer materials for forming the gates using the first etch mask; and then forming a second etch mask to expose any one portion of the plurality of portions, the gate electrode and the first etch mask formed on and/or over the any one portion; and then and etching any one portion exposed using the second etch mask.

In the step of forming the gate electrode, the first etch mask remains on and/or over the gate electrode formed after etching the layer material for forming the gate using the first etch mask. In the step of forming the second etch mask, the second etch mask pattern completely covering other portions other than the any one portion may be formed. In the step of etching the any one exposed portion, the any one exposed portion may be etched to the same thickness of another portion of the plurality of portions. The gate insulating layer may have a first thickness in a first portion of the plurality of portions, a second thickness thicker than the first thickness in a second portion of the plurality of portions, and a third thickness thicker than the second thickness in a third portion of the plurality of portions. For example, the first thickness may be 20 to 30 Å, the second thickness may be 120 to 140 Å, and the third thickness may be 750 to 850 Å. The second etch mask may be formed exposing the third portion, the gate electrode formed on and/or over the third portion, and the first etch mask and covering the first portion and the second portion, the gate electrode formed on the first portion and the second portion and the first etch mask. In the step of etching the any one exposed portion, the third portion may be etched to have the same thickness as the second portion or the third portion may be etched to have the same thickness as the first portion.

Embodiments relate to a method for fabricating a semiconductor device that may include at least one of the following steps: forming a plurality of gate insulating layers of different thicknesses on a substrate having low, medium and high voltage regions; and then depositing a gate layer material on the gate insulating layers in the low, medium and high voltage regions; and then forming first etch masks on the gate layer material; and then forming gate electrodes in the low, medium and high voltage regions, respectively, by etching the gate layer material using the first etch mask; and then forming a second etch mask exposing one of the gate electrodes, the first etch masks and the gate insulating layers formed in any one of the low, medium and high voltage regions; and then etching the exposed one of the gate electrodes, the first etch masks and the gate insulating layers using the second etch mask.

DRAWINGS

Example FIGS. 1A to 1E illustrate a method for forming a semiconductor device.

Example FIGS. 2A to 2F illustrate a method for forming a semiconductor device, in accordance with embodiments.

Figure 3:
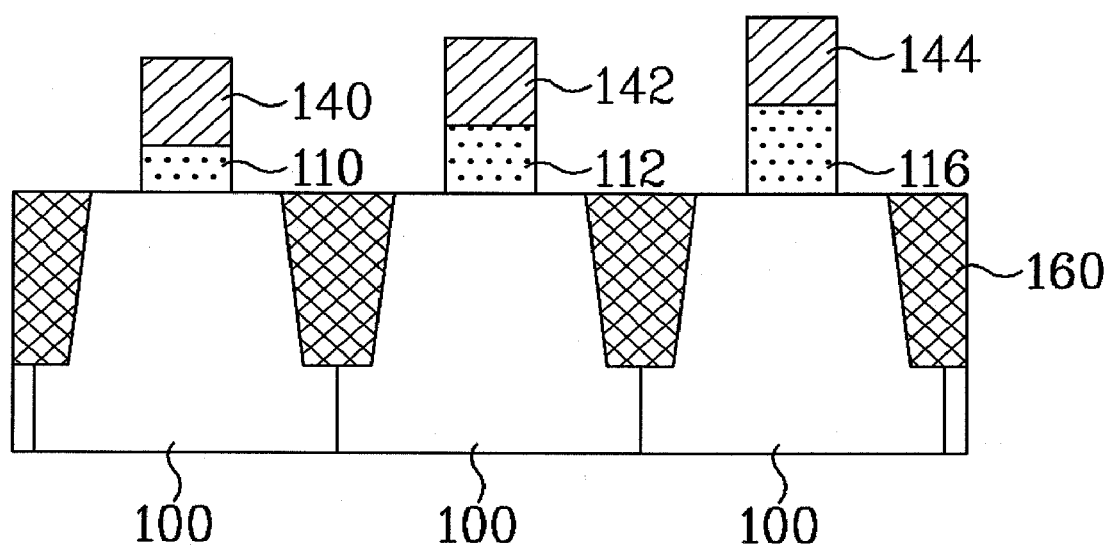

Example FIG. 3 illustrates a semiconductor device, in accordance with embodiments.

Figure 2A:
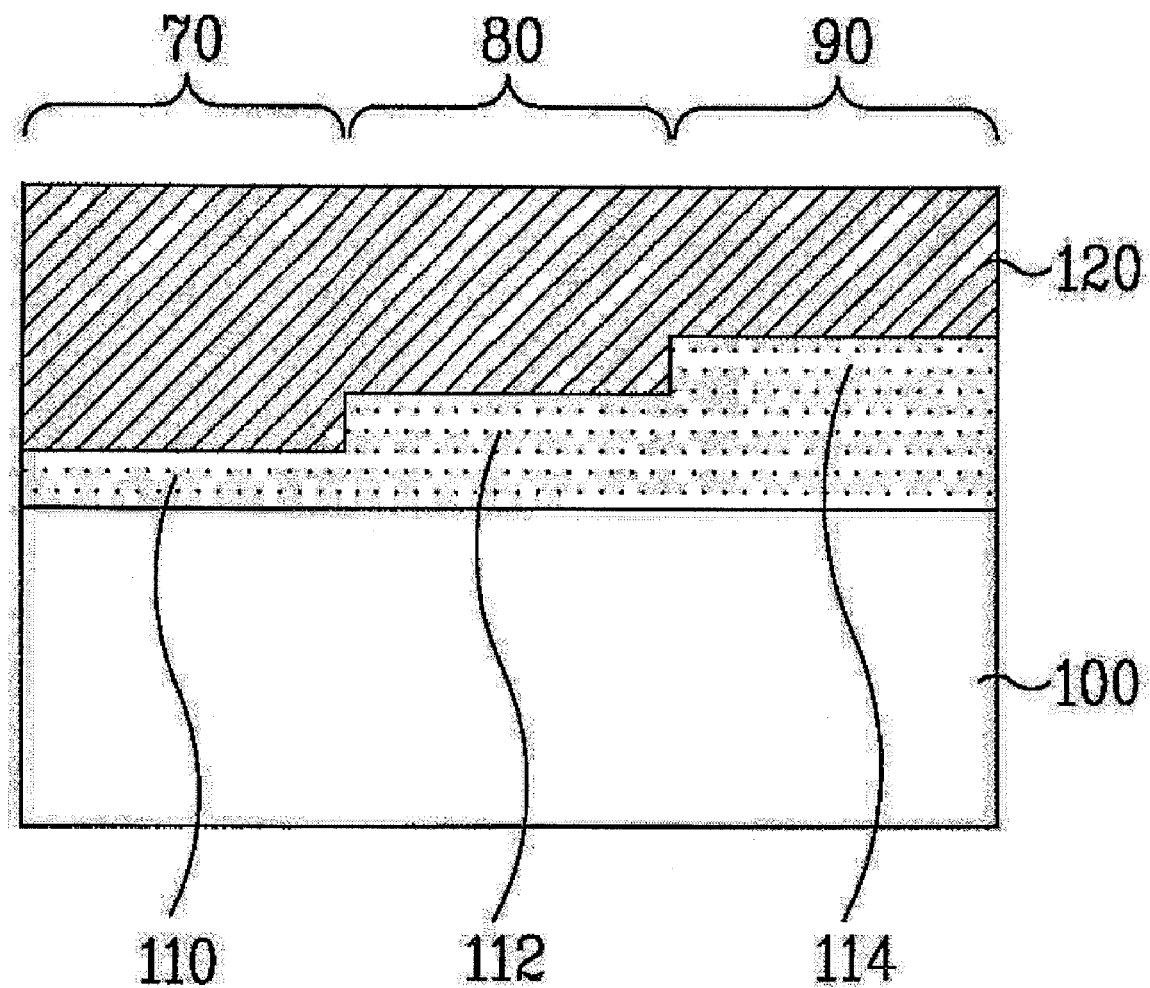
Figure 2B:
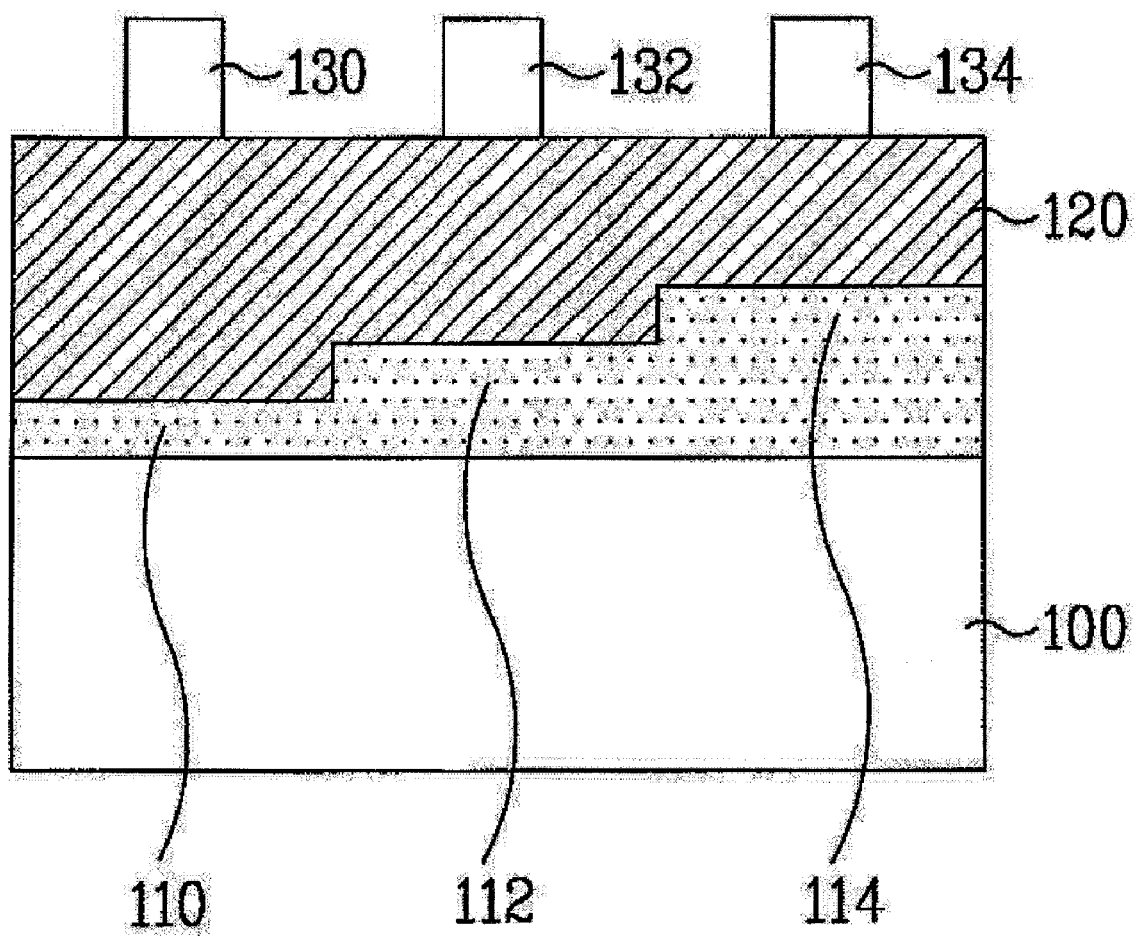
Figure 2D:
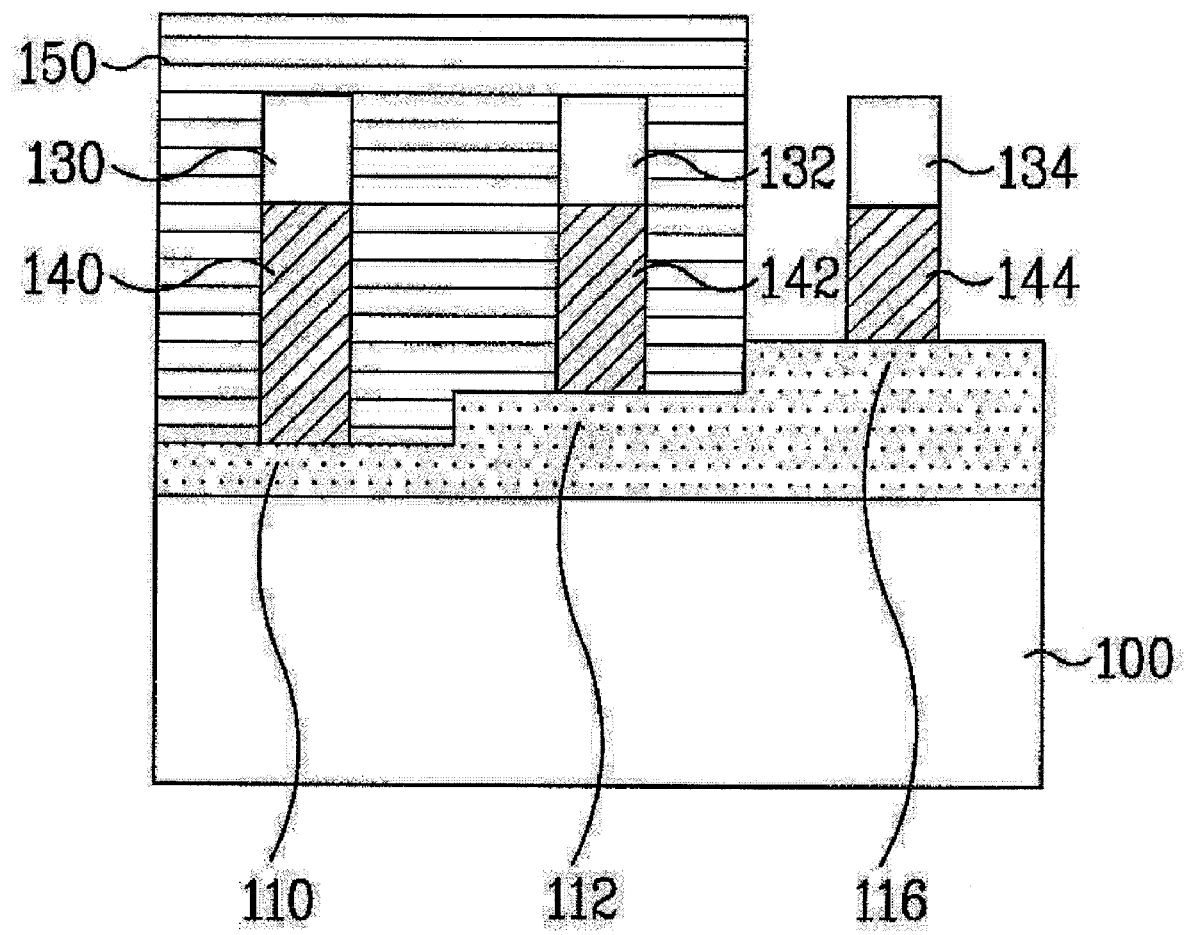
Figure 4:
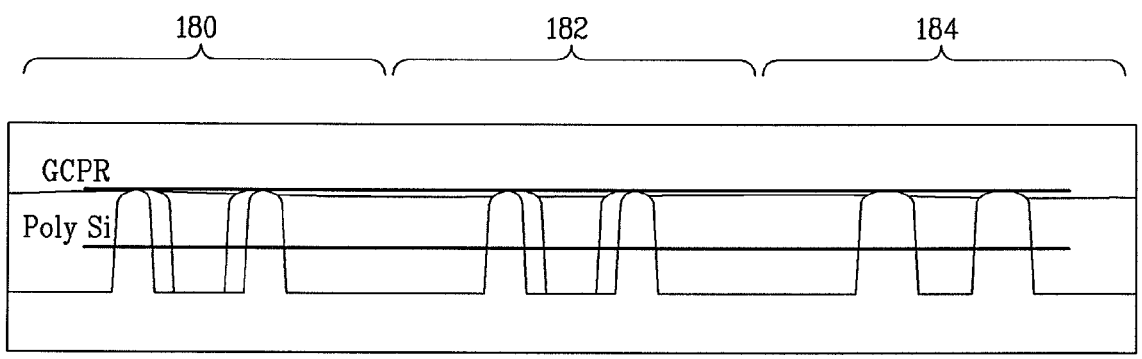

Example FIG. 4 illustrates geometric shapes of a remaining first etch mask upon forming a second etch mask as illustrated in example FIG. 2D.

DESCRIPTION

Hereinafter, embodiments of a method of fabricating a semiconductor device will be described with the accompanying drawings. In order to understand the embodiments, although a method for manufacturing for fabricating a semiconductor device with a triple structure is described, the embodiments are not limited thereto and may be applied to a method for fabricating a semiconductor device with a double gate structure or a quadruple gate structure.

As illustrated in example FIG. 2A, at least two gate insulating layers 110, 112, and 114 having different thickness may be formed on and/or over semiconductor substrate 100 and gate layer material 120 may be formed on and/or over gate insulating layers 110, 112, and 114. The thickness of gate insulating layer 110 in low voltage region 70 may be less than that of gate insulating layer 112 in medium voltage region 80. The thickness of gate insulating layer 112 in medium voltage region 80 may be less than that of gate insulating layer 114 in high voltage region 90. For example, the thickness of gate insulating layer 110 may be 20 to 30 Å, the thickness of gate insulating layer 112 may be 120 to 140 Å, and the thickness of gate insulating layer 114 may be 750 to 850 Å. The description of the various methods for forming gate insulating layers 110, 112, and 114 with different thickness on and/or over semiconductor substrate 100 will be omitted.

As illustrated in example FIG. 2B, first etch masks 130, 132, and 134 may be formed on and/or over gate layer materials 120 to form gates in each region 70, 80, and 90. First etch masks 130, 132, and 134 may be formed through an exposure phenomenon and a developing phenomenon after applying a photo resist.

As illustrated in example FIG. 2C, gate layer material 120 for the gate in each region 70, 80, and 90 may then be subjected to an anisotropic etching (etchback) using first etch masks 130, 132, and 134 to form gate electrodes 140, 142, and 144.

As illustrated in example FIG. 2D, second etch mask 150 may then be formed to expose the thickest gate insulating layer 116, gate electrode 144 formed on and/or over gate insulating layer 116 and first etch mask 134 formed on and/or over gate electrode 144 while covering remaining regions 110, 112, including first etch mask 130 and 132 and gate electrodes 140 and 142. In essence, second etch mask 150 may be formed to expose high voltage region 90 while covering low voltage region 70 and medium voltage region 80. Second etch mask 150 may be formed by applying a photo resist on and/or over semiconductor substrate 100 and then exposing and developing the photo resist.

Figure 2E:
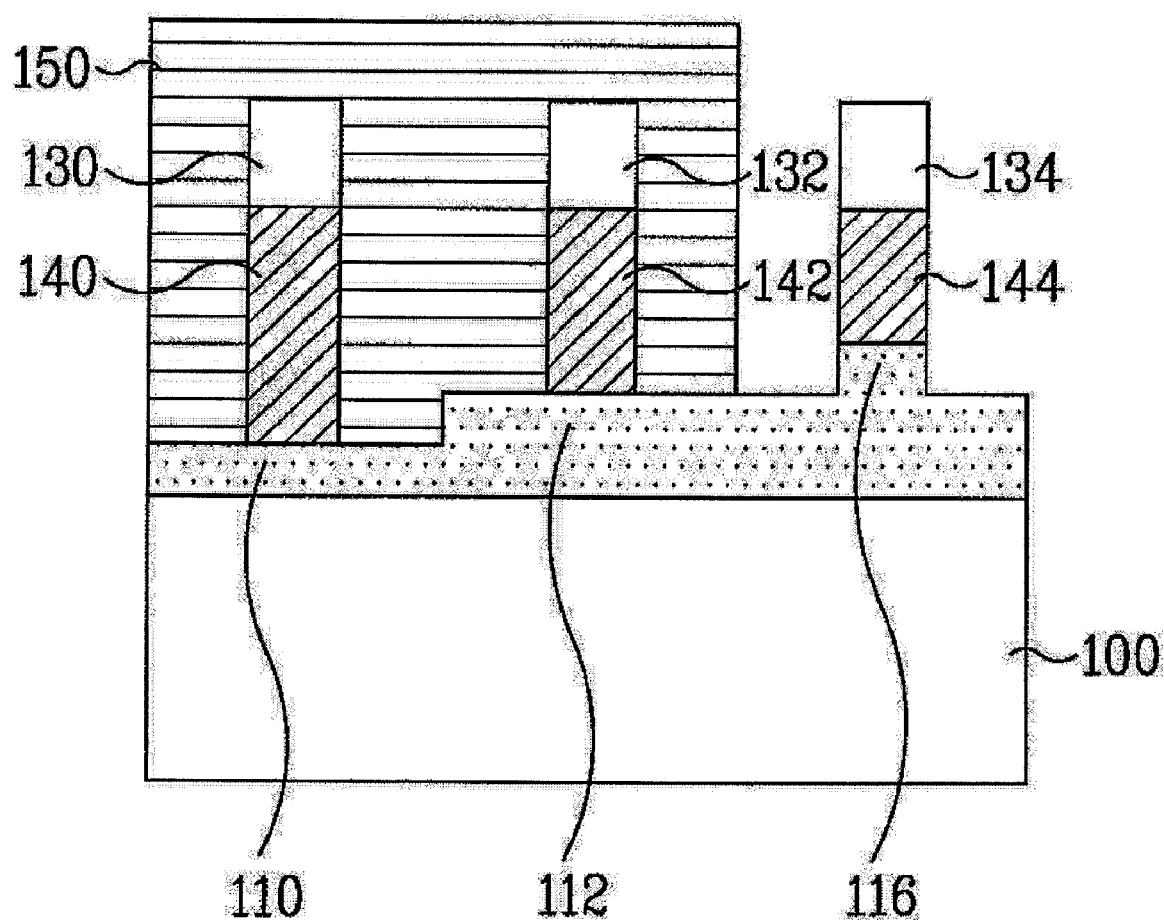

As illustrated in example FIG. 2E, the thickest gate insulating layer 116 may then be etched to the thickness of neighboring gate insulating layer 112 using second etch mask 150. The thickness of gate insulating layer 116 in high voltage region 90 is even larger than that of gate insulating layer 112 in medium voltage region 80, so that the thickness of gate insulating layer 116 should be etched to the thickness of gate insulating layer 112. However, since the thickness of gate insulating layer 112 in medium voltage region 80 is slightly larger than that of gate insulating layer 110 in low voltage region 110, the process of etching gate insulating layer 112 to thickness of gate insulating 110 is not performed. However, when the thickness of gate insulating layer 112 is greatly larger than that of gate insulating layer 110, gate insulating layer 112 may be etched to the thickness of gate insulating layer 110 in accordance with the same process illustrated in example FIGS. 2D and 2E.

Figure 2F:
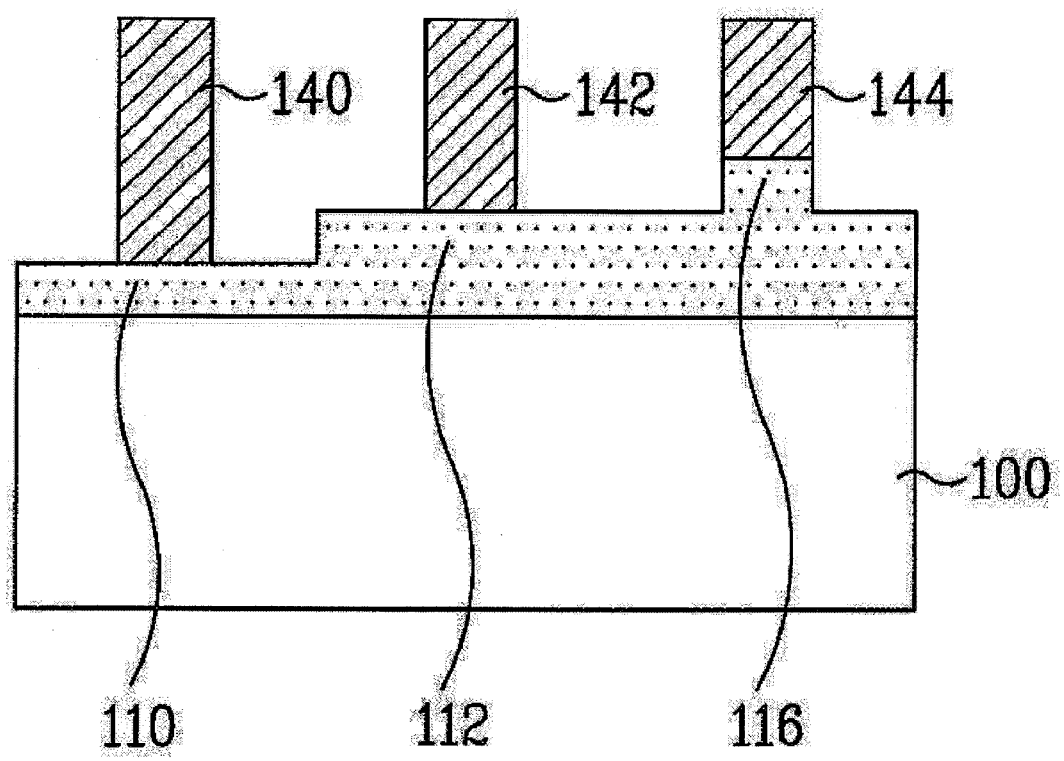

As illustrated in example FIG. 2F, first and second etch masks 130, 132, 134, and 150 may then be removed. After first and second etch masks 130, 132, 134, and 150 are removed, since there may be residuals of first and second etch masks 130, 132, 134, and 150, a cleaning process may be performed. When the semiconductor device formed in accordance with embodiments is an LDI, three types of triple gate structures may be formed in a wafer in the characteristics of the LDI.

As illustrated in example FIG. 3, in accordance with embodiments a semiconductor device may include device isolating layer 160 formed in semiconductor substrate 100 by first forming a trench in substrate 100 and then filling the trench with a material for forming device isolating layer 160. Gate insulating layers 110, 112, and 116 formed in a low voltage region, a medium voltage region and a high voltage region, respectively, may be isolated from each other by device isolating layer 160. Except for the formation of device isolating layer 160 isolating each gate insulating layer 10, 112 and 116 from each other, the fabricating method described herein and illustrated in example FIGS. 2A to 2F may be applied to the fabrication of the semiconductor device illustrated in example FIG. 3.

As illustrated in example FIG. 4, shapes of the remaining first etch mask by a subsequent process upon forming second etch mask 150 as illustrated in example FIG. 2D, whereby GC, PR represents the first etch mask and Poly Si represents the gate layer material. Although photo mask 55 used for forming the gates is removed after forming the gate in each region 10, 20, and 30 illustrated in example FIG. 1A, in accordance with embodiments, when first etch mask 134 not removed even after the aforementioned gate is formed performs a role of protecting gate 144 when etching gate insulating layer 116. Therefore, the attack of gate 144 in high voltage region 90 can be prevented. In order to perform the role of an etching barrier, first etch mask 134 should have the maintainable thickness without being removed in the subsequent process. The subsequent process may be a developing process involved when forming second etch mask 150, as described above. Also, the subsequent process may be a rework process performed after second etch mask 150 is formed. The rework process may include a process of exposing high voltage region 90 satisfactorily using a thinner, when high voltage region 90 is not exposed satisfactorily upon forming second etch mask 150 exposing only high voltage region 90, as illustrated in example FIG. 2D.

As illustrated in example FIG. 4, comparing shape 180 of first etch mask GC PR remaining after forming gate GC and shape 182 of first etch mask GC PR remaining after it is subjected to the subsequent process of the rework, and shape 184 of first etch mask GC PR remaining after it is subjected to the subsequent process of the rework, it can be appreciated that first etch mask GC PR remains without being removed by the subsequent process.

As described above, with the method for fabricating the semiconductor device in accordance with embodiments, a first etch mask used for forming a gate remains without being removed even after the gate is formed to perform a role of a barrier during etching the gate insulating layer. Accordingly it becomes possible to prevent the gate formed thereon from being poly attacked when performing a reactive ion etching on the gate insulating film. Moreover, the process of removing photo resist 56 as illustrated in example FIG. 1B is omitted, making it possible to enhance yield.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for fabricating a semiconductor device comprising:
    forming at least two gate insulating layers having different thickness on a substrate having low, medium and high voltage regions; and then
    depositing a gate layer material on the gate insulating layers; and then
    forming a first etch mask on the gate layer material; and then
    forming gate electrodes in the low, medium and high voltage regions by etching the gate layer material using the first etch mask; and then
    forming a second etch mask to expose a thickest one of the gate insulating layers, the gate electrode and the first etch mask each formed in the high voltage region while covering the remaining gate insulating layers, the gate electrodes and the first etch masks formed in the low and medium voltage regions; and then
    etching the thickest gate insulating layer using the second etch mask; and then
    removing the first and second etch masks.

2. The method of claim 1, wherein the gate insulating layer in the low voltage region has a thickness of 20 to 30 Å, the gate insulating layer in the medium voltage region has a thickness of 120 to 130 Å, and the gate insulating layer in the high voltage region has a thickness of 750 to 840 Å.

3. The method of claim 1, further comprising, before forming the gate insulating layers: forming device isolating layers in the substrate to isolate the gate insulating layers from each other.

4. The method of claim 1, further comprising, after removing the first and second etch masks: cleaning residuals of the first and second etch masks remaining on the substrate.

5. The method of claim 1, wherein the first etch mask has a maintainable thickness in a subsequent process.

6. The method of claim 5, wherein the subsequent process comprises a developing process for forming the second etch mask.

7. The method of claim 5, wherein the subsequent process comprises a rework process for exposing the thickest gate insulating layer after forming the second etch mask.

8. A method for fabricating a semiconductor device comprising:
    forming a plurality of gate insulating layers of different thicknesses on a substrate having low, medium and high voltage regions; and then
    depositing a gate layer material on the gate insulating layers in the low, medium and high voltage regions; and then
    forming first etch masks on the gate layer material; and then
    forming gate electrodes in the low, medium and high voltage regions, respectively, by etching the gate layer material using the first etch mask; and then
    forming a second etch mask exposing one of the gate electrodes, the first etch masks and the gate insulating layers formed in any one of the low, medium and high voltage regions; and then
    etching the exposed one of the gate electrodes, the first etch masks and the gate insulating layers using the second etch mask.

9. The method of claim 8, wherein the first etch mask remains on the gate electrodes after etching the gate layer material using the first etch mask.

10. The method of claim 8, wherein forming the second etch mask further comprises completely covering unexposed one of the gate electrodes, the first etch masks and the gate insulating layers formed in the low, medium and high voltage regions.

11. The method of claim 8, wherein etching the exposed gate electrode, first etch mask and gate insulating layer comprises etching the exposed gate electrode, first etch mask and gate insulating layer to the same thickness of any one of the gate electrodes, the first etch masks and the gate insulating layers that are unexposed.

12. The method of claim 8, wherein forming the gate insulating layers comprises forming a first gate insulating layer in the low voltage region having a thickness less than a thickness of a second gate insulating layer formed in the medium voltage region.

13. The method of claim 12, wherein forming the gate insulating layer comprises forming the second gate insulating layer in the medium voltage region with a thickness less than a thickness of a third gate insulting layer formed in the high voltage region.

14. The method of claim 8, wherein the thickness of the first gate insulating layer in the low voltage region is 20 to 30 Å, the thickness of the second gate insulating layer in the medium voltage region is 120 to 140 Å, and the thickness of the third gate insulating layer in the high voltage region is 750 to 850 Å.

15. The method of claim 8, further comprising, before forming the gate insulating layers: forming device isolating layers in the substrate.

16. The method of claim 8, further comprising, after etching the exposed one of the gate electrodes, the first etch masks and the gate insulating layers:
    removing the first and second etch masks.

17. The method of claim 16, further comprising, after removing the first and second etch masks: cleaning residuals of the first and second etch masks remaining on the substrate.

18. The method of claim 8, wherein the first etch masks has a maintainable thickness in a subsequent process.

19. The method of claim 18, wherein the subsequent process comprises a developing process for forming the second etch mask.

20. The method of claim 18, wherein the subsequent process comprises a rework process for exposing the thickest gate insulating layer after forming the second etch mask.

* * * * *